United States Patent
Orban et al.

(10) Patent No.: US 9,590,319 B2
(45) Date of Patent: Mar. 7, 2017

(54) CIRCULARLY POLARIZED ANTENNA AND FEEDING NETWORK

(71) Applicant: ORBAN MICROWAVE PRODUCTS (OMP), N.V., Leuven (BE)

(72) Inventors: Daniel Orban, Leuven (BE); Gerald Moernaut, Leuven (BE)

(73) Assignee: ORBAN MICROWAVE PRODUCTS (OMP), N.V., Leuven (BE)

( * ) Notice: Subject to any disclaimer, the term of this patent is extended or adjusted under 35 U.S.C. 154(b) by 0 days.

(21) Appl. No.: 14/974,527

(22) Filed: Dec. 18, 2015

(65) Prior Publication Data

US 2016/0181704 A1    Jun. 23, 2016

Related U.S. Application Data

(63) Continuation of application No. 13/576,054, filed as application No. PCT/EP2011/051261 on Jan. 28, 2011, now Pat. No. 9,252,500.

(60) Provisional application No. 61/299,467, filed on Jan. 29, 2010.

(51) Int. Cl.

| H01Q 21/00 | (2006.01) |
| H01Q 1/50 | (2006.01) |
| H01P 5/18 | (2006.01) |
| H01P 5/12 | (2006.01) |
| H01Q 21/24 | (2006.01) |
| H03H 7/48 | (2006.01) |
| H03H 7/18 | (2006.01) |
| H01Q 9/04 | (2006.01) |
| H01Q 21/06 | (2006.01) |
| H01Q 5/357 | (2015.01) |
| H01P 1/38 | (2006.01) |

(52) U.S. Cl.
CPC ........... *H01Q 21/24* (2013.01); *H01P 1/38* (2013.01); *H01P 5/18* (2013.01); *H01Q 1/50* (2013.01); *H01Q 5/357* (2015.01); *H01Q 9/0421* (2013.01); *H01Q 9/0442* (2013.01); *H01Q 21/065* (2013.01); *H03H 7/18* (2013.01); *H03H 7/48* (2013.01)

(58) Field of Classification Search
CPC .................................. H03H 7/48; H03H 7/21
USPC .................................................. 333/109, 117
See application file for complete search history.

(56) References Cited

U.S. PATENT DOCUMENTS

| 4,783,661 A | 11/1988 | Smith |
| 5,406,292 A | 4/1995 | Schnetzer et al. |
| 5,659,322 A * | 8/1997 | Caille ............... H01Q 21/245 342/188 |
| 5,786,793 A | 7/1998 | Maeda et al. |
| 6,618,016 B1 * | 9/2003 | Hannan ............. H01Q 1/28 343/705 |

(Continued)

OTHER PUBLICATIONS

Written Opinion and International Search Report issued in PCT/EP2011/051261, Aug. 3, 2011.
Written Opinion issued in PCT/EP2011/051261, Feb. 3, 2012.

*Primary Examiner* — Dameon E Levi
*Assistant Examiner* — Ricardo Magallanes
(74) *Attorney, Agent, or Firm* — Bacon & Thomas, PLLC

(57) ABSTRACT

An antenna for transmitting and/or receiving electromagnetic waves having a flat ground plane, and an array of radiating and/or receiving elements. The radiating and/or receiving element has a planar conductor which is arranged in parallel to the ground plane. An L-shaped slot is arranged in the planar conductor.

20 Claims, 6 Drawing Sheets

(56) References Cited

U.S. PATENT DOCUMENTS

| | | |
|---|---|---|
| 7,477,201 B1 | 1/2009 | Bit-Babik et al. |
| 2003/0052825 A1* | 3/2003 | Rao .................... H01Q 9/0407 343/700 MS |
| 2006/0044186 A1 | 3/2006 | Coppi et al. |
| 2007/0126638 A1 | 6/2007 | Channabasappa |
| 2007/0262905 A1 | 11/2007 | Iio |
| 2009/0289868 A1 | 11/2009 | Granger |

* cited by examiner

CIRCULARLY POLARIZED ANTENNA AND FEEDING NETWORK

CROSS REFERENCE TO RELATED APPLICATIONS

This application is a continuation application of U.S. application Ser. No. 13/576,054 filed Jul. 30, 2012, which is the national stage of PCT/EP2011/051261, filed Jan. 28, 2011, which claims the benefit of the filing date of U.S. provisional patent application Ser. No. 61/299,467, filed Jan. 29, 2010, the entire contents of both of which are incorporated by reference in their entirety.

The present invention relates to a transmit and/or receive antenna, handling in particular circularly polarized electromagnetic waves and having a hemispherical radiation pattern. The present invention also relates to a feeding network.

TECHNICAL BACKGROUND

Different approaches for such an antenna with circularly polarized electromagnetic waves having a hemispherical radiation pattern exist. In particular, the global positioning system (GPS) is a global navigation satellite system, which necessitates the use of optimized antennas. GPS satellites broadcast radio signals to enable GPS receivers to determine location and synchronized time. GPS signals include ranging signals, used to measure the distance to the satellite, and navigation messages. The navigation messages include data, used to calculate the position of the satellite in orbit, and information about the time and status of the entire satellite constellation, called the almanac. This information is modulated onto an electromagnetic signal having a predetermined polarization. These antennas have particular requirements that must be met.

For example, a relatively high transmission bandwidth is desirable, such that the antenna can be operated across a large frequency range. Next, the radiation pattern of the antenna should preferably be hemispherical such that signals are received from as many satellites as possible. Finally, a good circular polarization is required across the bandwidth of the antenna. However, other applications for such an antenna are also possible. For example GB 2,198,290 discloses a dual-band circularly polarised antenna with hemispherical coverage. U.S. Pat. No. 7,477,201 discloses a low profile antenna pair system.

SUMMARY OF THE INVENTION

Therefore, it is object of the present invention to provide an alternative antenna for receiving and/or transmitting circularly polarized waves. An advantage of embodiments of the present invention is that the antenna can transmit and/or receive across a large frequency range and with a hemispheric radiation pattern and good axial ratio.

This object is solved by an antenna according to the present invention. Preferred embodiments are described in the dependent claims.

The antenna for radiating and/or receiving electromagnetic waves according to the present invention comprises a flat ground plane and at least two radiating and/or receiving elements. In a preferred embodiment, four radiating and/or receiving elements are used, each comprising a planar conductor. The planar conductors are arranged in parallel to the ground plane. An L-shaped slot is arranged in each of the said four planar conductors. Each of the 4 planar conductors with L-shaped slots has at least 2 resonances which can be tuned such that they are closely spaced to yield one frequency band. Thereby, the frequency range of the antenna may be increased. The combined 4 planar conductors with the L-shaped slot make up the four radiating and/or receiving elements which, in conjunction with a suitable feeding network, transmit and/or receive circularly polarized waves within said frequency band.

According to a preferred embodiment of the present invention, a radiating and/or receiving element comprises a connector such as a connecting plate or a connecting post or a linear array of connecting posts for connecting each of the 4 planar conductors to the ground plane. The connectors such as connecting plates or the connecting post or linear array of connecting posts are arranged perpendicular to both the ground plane and the planar conductors. The connectors such as the connecting plates or the post or linear array of connecting posts may both support the planar conductors above the ground plane and provide a short between the ground plane and the planar conductors.

Preferably, each radiating and/or receiving element comprises a feed probe. One probe is connected to each of the planar conductors. The probes provide a simple means for connecting to the antenna with appropriate signals in order to transmit and/or receive corresponding electromagnetic waves.

Preferably, in the antenna according to the present invention, the radiating and/or receiving elements are provided by an array of four planar conductors. These planar conductors have essentially the same electromagnetic properties. The four planar conductors are arranged around an axis of symmetry perpendicular to the ground plane. Each one of said planar conductors may be mapped onto an adjacent one of said planar conductors by rotating said one planar conductor by 90° around the axis of symmetry. The particular arrangement of 4 planar conductors creates a hemispherical radiation pattern when fed with a feeding network. The radiation is circularly polarized. This necessitates that the particular radiating and/or receiving elements are fed by the feeding network with signals with a sequential 90° phase difference and of equal amplitude.

According to a particular embodiment of the present invention, said ground plane forms a surface of a ground body having an annular cavity. An axis of symmetry of said annular cavity is perpendicular to the ground plane. Preferably, the annular cavity is arranged essentially parallel to the ground plane such that the annular cavity and the radiating and/or receiving elements are positioned on opposite sides of the ground plane. The axis of symmetry of the radiating and/or receiving elements is essentially identical with the axis of symmetry of the annular cavity.

The annular cavity is basically a wave-guide structure, which may be used around its cut-off frequency. Two spaced plates preferably make up the waveguide and these can be of different radius. The bandwidth of said wave-guide structure is narrow. The annular cavity suppresses the transmission of radiation by the antenna towards the back and enhances the transmission of radiation by the antenna towards the front of the antenna, when it is operated near its resonance frequency. The suppression degrades when moving away from the resonance frequency. Increasing frequency means that the wave-guide is electrically too large. However, this has a very useful side effect, namely improved circular polarization at low elevations. The annular cavity is preferably implemented in such a way that it improves the circular polarization of the antenna over larger frequency ranges by positioning the resonance frequency of the annular cavity below the frequency of operation of the antenna without degrading the overall bandwidth of the antenna. The arrangement of a ground body including one or more ground planes and the annular cavity is advantageous in this respect.

The present invention also provides a feeding network providing electrical coupling with an antenna, namely for connecting radiating and/or receiving elements of the antenna to each other. The feeding network preferably comprises:

one input and a first, second, third and fourth output, each of said outputs being connected to one of said radiating and/or receiving elements via a feed probe (50) of each radiating and/or receiving element, said feeding network (120) being adapted to generate a first, second, third and fourth output signals from a single input signal at the first, second, third and fourth output, respectively, wherein the first output signal is phase shifted by 90° in relation to the second output signal, by 180° in relation to the third output signal and by 270° in relation to the fourth output signal.

The feeding network can also be used in receive mode in which case the input and output signals are reversed. Hence, the present invention also provides a feeding network providing electrical coupling with an antenna, namely for connecting receiving elements of the antenna to each other. The feeding network preferably comprises:

one output and a first, second, third and fourth input, each of said inputs being connected to one of said receiving elements via a feed probe (50) of each radiating and/or receiving element, said feeding network (120) being adapted to receive a first, second, third and fourth input signal, respectively, wherein the first input signal is phase shifted by 90° in relation to the second input signal, by 180° in relation to the third input signal and by 270° in relation to the fourth input signal.

By this arrangement a combination of received or transmitted signals at the individual radiating and/or receiving elements is made. Discrimination between polarizations can be done by introducing a sequential phase shift. The radiating and/or receiving elements can be electromagnetically coupled to some extent because they are closely spaced. In a preferred embodiment, any two neighbouring radiating and/or receiving elements are fed in phase quadrature, i.e. orthogonal, thus isolated from a feeding network perspective. From an antenna perspective, the radiating and/or receiving elements and the feeding network operate as a single radiating and/or receiving structure.

Hereafter, preferred embodiments of the present invention will be described with reference to the accompanying drawings. Please note that the preferred embodiments are merely exemplary. The skilled person may devise alternative implementations of the present invention as defined in the accompanied claims.

DETAILED DESCRIPTION OF THE PRESENT INVENTION

Figure 1:
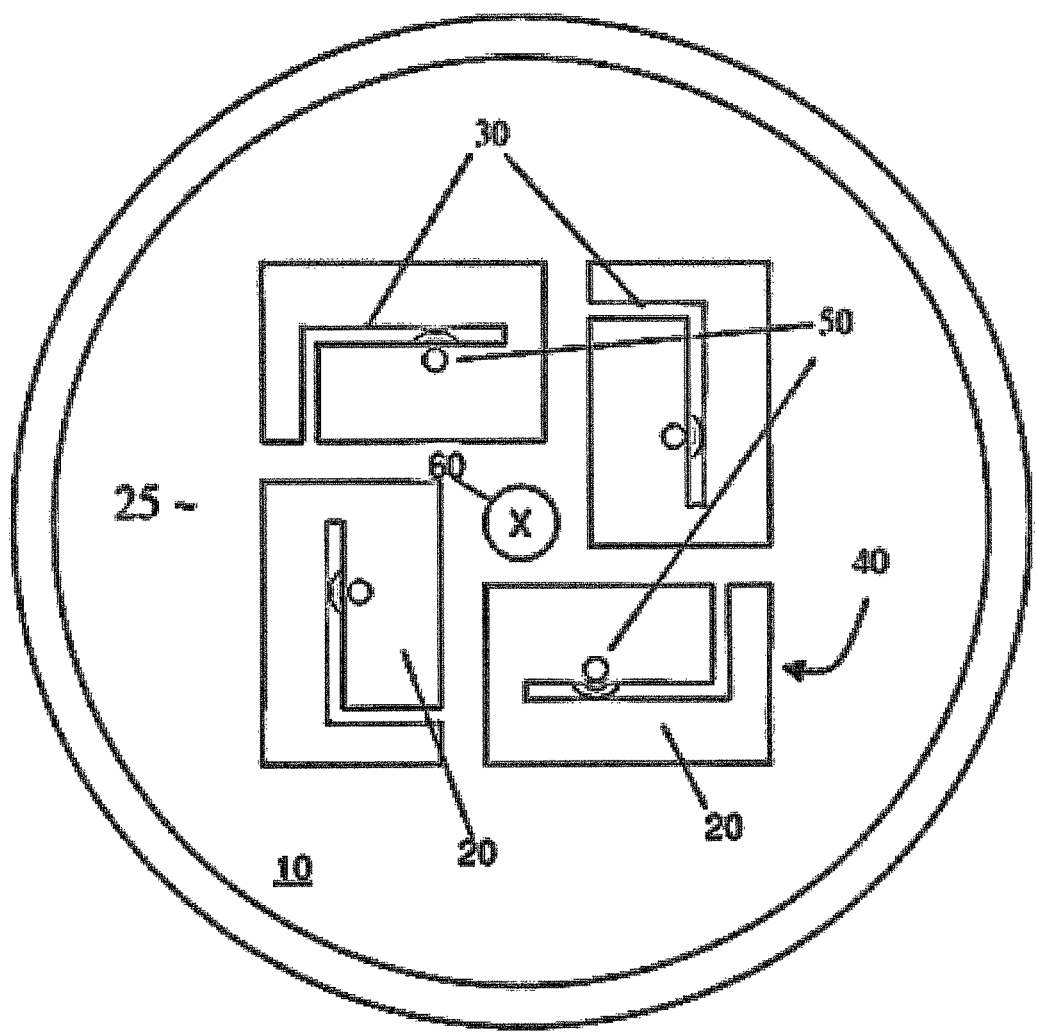
FIG. 1 shows a top view of an antenna according to a preferred embodiment of the present invention.

The present invention will be described with respect to particular embodiments and with reference to certain drawings but the invention is not limited thereto but only by the claims. Any reference signs in the claims shall not be construed as limiting the scope. The drawings described are only schematic and are non-limiting. In the drawings, the size of some of the elements may be exaggerated and not drawn on scale for illustrative purposes. Where the term <<comprising>> is used in the present description and/or claims, it does not exclude the presence of other elements or steps.

Where an indefinite article is used when referring to a singular noun e.g. <<a>>, <<an>> or <<the>>, this includes a plural of that noun unless something else is specifically stated.

Furthermore, the terms first, second, third and the like in the description and/or in the claims are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

A preferred embodiment of the present invention is depicted in FIG. 1, which shows a top view of an antenna. The antenna can be used for transmitting and/or receiving electromagnetic waves, preferably microwaves or radio waves. The antenna comprises a ground plane 10. The ground plane can be essentially circular and preferably made out of an electrically conductive material. Plural radiating and/or receiving elements in an array 25 are arranged on top of said ground plane. The shape as well as the arrangement of radiating and/or receiving elements is instrumental in generating the desired electromagnetic wave. It is desired to have an antenna, which may radiate a circular polarized hemispherical radiation pattern. Additionally, the desired radiation pattern should be maintained across a relatively large frequency bandwidth of the radiated signal. A good circular polarization over this frequency bandwidth should be maintained, while changes in the radiation pattern shape are minimized.

Turning to the particular shape of the radiating and/or receiving elements, it is pointed out that each radiating and/or receiving element comprises a planar conductor 20, which is essentially two-dimensional, i.e. the width and length of the planar conductor is larger by a multiple magnitude of the thickness of the planar conductor 20. The planar conductors can therefore be described as made from sheet material. Each planar conductor has radiating edges of different length, e.g. is preferably rectangular in shape. The surface of the planar conductor 20 is arranged in parallel to the ground plane 10. Each planar conductor comprises an L-shaped slot 30, which may be formed by cutting out said shape from the planar conductor 20. Alternatively, the slot 30 may be etched out or made by any other means.

As indicated above, an outer circumference of the planar conductors preferably has a rectangular shape. The rectangular shape has a short side and a long side. A short leg of the L-shaped slot 30 is arranged in parallel and proximity of a short side of the rectangular shape forming the circumference of the planar conductor 20. The L-shaped slot is preferably completely surrounded at the short edge of the planar conductor by conductive parts of the radiating and/or receiving element, i.e. the L-shaped slot does not extend all the way to the short edge of the radiating and/or receiving element. Furthermore, the short leg extends all the way to the edge forming the long side of the rectangular shape. The long leg of the L-shaped slot is optionally placed between the long sides of the rectangular outer circumference. The L-slot element has at least 2 resonance frequencies. These frequencies may be tuned such that they are closely spaced. Thereby, the overall frequency response of said radiating and/or receiving element represents a relatively broad frequency band. Thus the radiating and/or receiving element is a wideband structure with a low quality factor Q. The quality factor Q is a dimensionless parameter defined by the $f_r/\Delta f$, where $f_r$ is the resonant frequency, $\Delta f$ is the frequency bandwidth.

Preferably the planar conductor is made out of copper.

Each planar radiating and/or receiving element may be described as a Planar Inverted F antenna. A planar Inverted F Antenna (PIFA) typically consists of a rectangular planar element located above a ground plane, a short circuiting plate or pin, and a feeding mechanism for the planar element.

The at least one ground plane of the antenna in accordance with the present invention plays a significant role in the operation. Excitation of currents in the PIFA cause excitation of currents in the ground plane or ground body. The resulting electromagnetic field is formed by the interaction of the PIFA and an image of itself below the ground plane.

Since each planar conductor 20 is suspended above the ground plane 10, a supporting structure is needed. Therefore, a connector such as a connecting plate 40 or a conductive post or a linear array of conductive posts is arranged between each planar conductor 20 and the ground plane 10. The connecting plate 40 is formed by a rectangular plate, which extends from a short side of the rectangular planar conductor 20 to the ground plane 10. The connecting plate is oriented essentially perpendicular to both ground plane and the planar conductor 20. Each radiating and/or receiving element must be supplied with an electrical signal in order to emit the desired electromagnetic wave or supplies a signal in receive mode. Therefore, a feed probe 50 forms a connection to the respective planar conductor 20. Furthermore, the connecting plate 40 forms a shorting wall, i.e. electrical current may flow from the planar conductor 20 to the ground plane 10 and vice versa with negligible ohmic resistance.

Subsequently, the particular arrangement of radiating and/or receiving elements on the ground plane shall be described. In FIG. 1, an array of four radiating and/or receiving elements is shown. Each of said radiating and/or receiving elements is in itself identical. The position and orientation of the array of radiating and/or receiving elements is important for the properties of said antenna as a whole. An axis of symmetry 60 is shown in FIG. 1. This axis is not a physical object but only a line of reference in order to describe precisely the arrangement of the radiating and/or receiving elements. Said axis 60 is oriented perpendicular to both the ground plane 10 and the planar conductors 20 of the radiating and/or receiving elements. The array 25 of radiating and/or receiving elements as a whole is a symmetrical arrangement with regard to the axis of symmetry 60. The array of radiating and/or receiving elements may be mapped onto itself by rotation of 90° around the axis of symmetry 60. Furthermore, each individual radiating and/or receiving element may be mapped onto a neighbouring radiating element by rotating said individual radiating and/or receiving element by integer multiples of 90° around the axis of symmetry 60. The plane conductors 20 of said array 25 of radiating and/or receiving elements all lie within the same flat plane parallel to the ground plane 10. They essentially form part of a square, wherein each rectangular plane conductor 20 is place into the corner of said square.

The concept of sequentially rotating 4 radiating and/or receiving elements and feeding the elements with a sequential 90° phase difference is used to create a circular polarized radiation pattern. The feeding network will be described later with reference to FIGS. 3 to 6.

Figure 2:
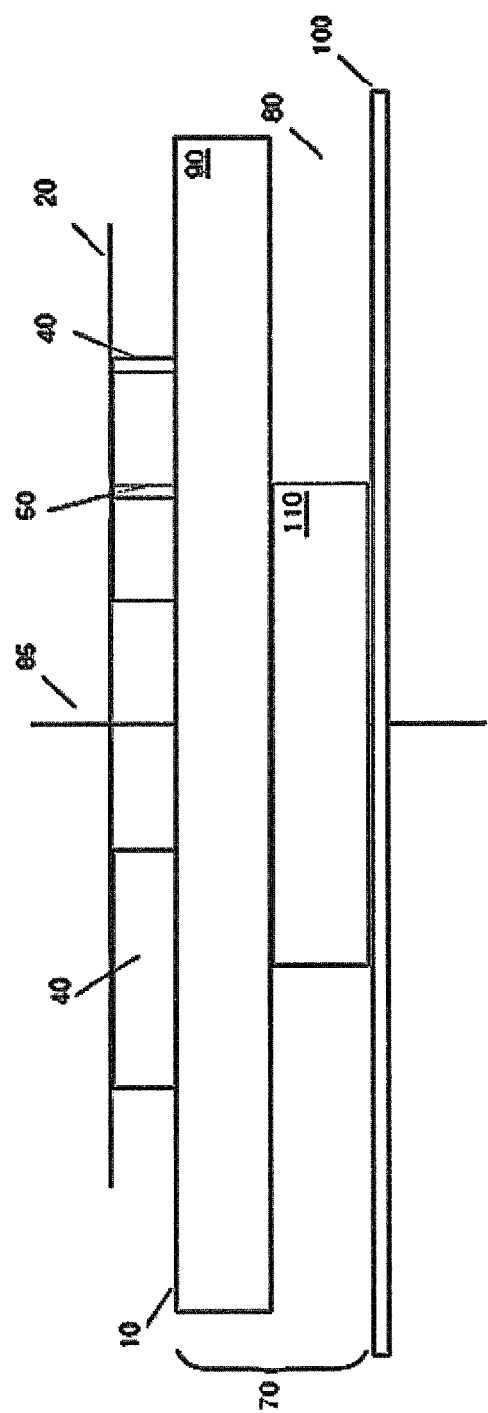
FIG. 2 shows a side view of the antenna according to the preferred embodiment.

FIG. 2 displays a side view of the antenna of the preferred embodiment. Identical reference signs in FIGS. 1 and 2 denote the same features in FIGS. 1 and 2. In this depiction, the essentially two-dimensional planar conductors 20 merely appear as a line. The flat ground plane 10 forms the surface of a larger ground body 70. The ground body 70 comprises a annular cavity 80 i.e. an annular air space or insulator space. Its annular shape is generated by revolving a geometrical figure around an axis external to that figure. Said axis of symmetry is represented in FIG. 2 by reference sign 85. Please note that this axis is merely a line of reference and does not denote a particular object. Furthermore, the axis of symmetry 85 of the annular cavity is identical with the axis of symmetry 60 for the array of radiating and/or receiving elements depicted in FIG. 1. The annular cavity is formed within the ground body 70. The annular air space or insulator space is essentially formed in a plane perpendicular to the axis of symmetry 85. The annular space may include any suitable insulator such as air or a foamed polymer, etc. The planar conductors 20 and the annular cavity are arranged on opposite sides of the ground plane 10.

The annular cavity 80 within the ground body 70 can be embodied as a choke ring. A choke ring is basically a half wave-guide structure with a particular resonance frequency and a bandwidth. Choke rings have quite narrow frequency bands compared to a 30% bandwidth requirement. The suppression of transmitted radiation degrades when moving away from the resonance frequency of the annular cavity 80. Increasing the frequency means that the choke ring is electrically too large. However, this has a very useful side effect, namely improved circular polarization at low elevations. An electrically small choke ring does not have this effect. These 2 effects are being used in the annular cavity 80.

A (wideband) antenna mounted on a normal ground plane has an electrically smaller ground plane at the lower end of the frequency band and an electrically larger ground plane at the higher end of the frequency band. The array 25 of radiating and/or receiving elements has a good circular polarization at the lower end of the frequency band and a worse circular polarization at the higher end of the frequency band. The front-to-back ratio is better at the higher end of the frequency band because the ground plane is electrically larger. Thus, tuning the choke ring slightly below the lower end of the frequency band, results in improved front-to-back ratio, radiation pattern shape stability and circular polarization over the entire frequency band. The addition of the annular cavity, e.g. in the form of a horizontal choke ring makes the ground plane maintain its electrical size over a much wider frequency range relative to the frequency range covered by the same ground plane but without the annular cavity. This makes the displayed annular cavity, e.g. horizontal choke ring design unique.

The particular implementation of the ground body 70 in FIG. 2 comprises three distinct features. Two discs 90 and 100 are separated by a conductive cylindrical body 110. An outer surface of disc 100 forms the second ground plane of the antenna. The first disc 90 can be, if desired, considerably thicker than the second disc 100. The diameter of both discs 90 and 100 can be different.

The axis of symmetry 85 is symmetrical in relation to the annular cavity 80 as well as the discs 90 and 100 and the cylindrical body 110. The first disc 90 and the cylindrical body 110 each comprise a closed cavity for taking in electronic components.

The diameters and thicknesses of all components of ground body 70 are preferably tuned to fit the associated feed electronics, to create a support for a radome as well as optimum electromagnetic behaviour for the target application.

In order to generate circular polarized electromagnetic radiation with said antenna, the radiating and/or receiving elements must be fed with an appropriate signal. The input signal must be distributed to each radiating and/or receiving element, such that the radiating and/or receiving elements are excited with signals having a sequential 90° phase difference in relation to each other. Additionally, the feeding network must be adapted to provide these exciting signals across a large bandwidth in order to take advantage of the bandwidth of the antenna. Therefore, the problem shifts to designing a feeding network with the correct phase and magnitude behaviour. It is to be understood that even if the description mainly refers to transmit, the feeding network can be used in receive or in transmit.

The feed network operates as an electrical coupler between the radiating or receiving antenna elements of an antenna and external electronics and will be described with reference to FIGS. 3 and 4.

A 90° coupler is a device that is used to equally split an input signal into two output signal with a resultant 90° phase difference between output signals. This coupler may be described as a differential phase splitter. A 180° coupler is a device that is used to equally split an input signal into two output signal with a resultant 180° phase difference between output signals. This coupler may be described as a differential phase splitter.

Figure 3:
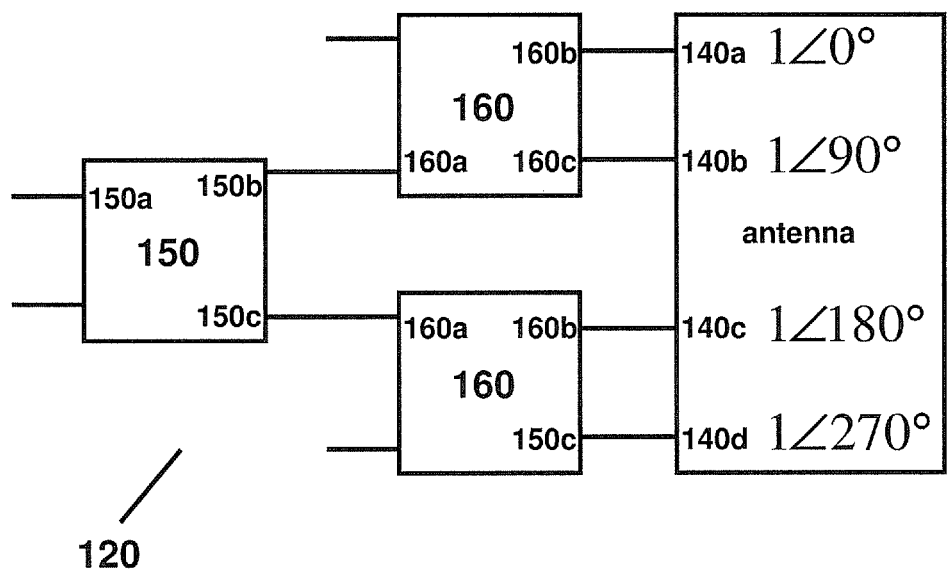
FIG. 3 shows a block diagram of a first embodiment of a feeding network for connecting radiating and/or receiving elements of the antenna.

FIG. 3 shows a schematic block diagram of an embodiment of a feeding network 120, which may be used for receiving signals from or feeding signals to the radiating and/or receiving elements of the antenna according to the present invention. The feeding network when used in transmit mode has a single input 150*a* for receiving a signal, which is to be transmitted by the antenna. Four outputs 140*a*, 140*b*, 140*c* and 140*d* are also provided. Each of these outputs is connected to one radiating and/or receiving element via the feed probe. If a monochromatic signal is input to said electrical coupler, then the four outputs 140*a* to 140*c* each carry a signal with identical amplitude and the same frequency as the input signal. The four output signals are sequentially phase shifted by 90 degrees. The resulting phase shift is achieved by using two distinct phase shifters 150 and 160. A 180° coupler 150 is arranged at the outputs 150*b* and 150*c*. These signals are phase shifted by 180°. The next stage of the electrical coupler comprises two identical 90° couplers 160, which are connected to the output 150*b* and 150*c* of the 180° coupler, respectively. Both 90° couplers 160 divide the input signal into two equally strong signals with a 90° phase difference between them. Consequently, the four output signals from the two 90° couplers 160 are each phase shifted by 90°, 180 or 270° with respect to each other.

Figure 4:
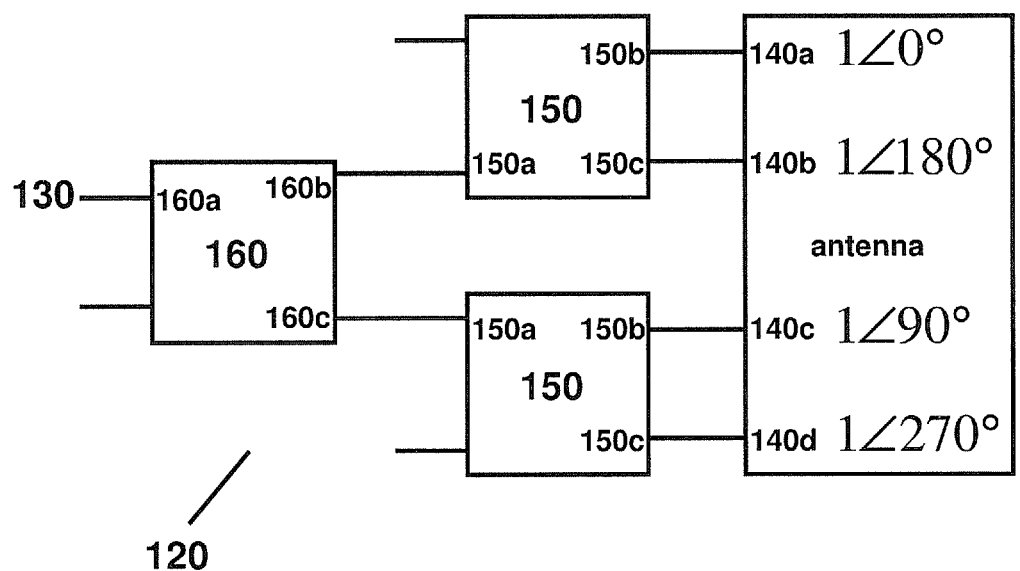
FIG. 4 shows a block diagram of a second embodiment of a feeding network for connecting radiating and/or receiving elements of the antenna.

FIG. 4 shows a further implementation of feeding network for use in the present invention. Since both FIGS. 3 and 4 comprises similar features, the same reference signs are used to depict the same features in FIGS. 1 and 2. The structure of FIG. 4 is basically created by exchanging the 180° coupler 150 of FIG. 3 with a 90° coupler and replacing the 90° couplers 160 of FIG. 3 with 180° couplers 150. Otherwise the overall structure is identical. The 90° coupler generates two identical output signals, which are phase shifted by 90°. The signals on outputs 140*b* and 140*c* are merely exchanged in comparison with the embodiment of FIG. 3.

The 90° coupler may be implemented by a quadrature coupler such as a branchline coupler also known as quadrature hybrid. For example, the branchline coupler may comprise four quarter wavelength transmission lines, which are connected to each other as to form a ring of transmission lines. A signal entering port 160*a* is split into two quadrature signals at ports 160*b* and 160*c*, with the remaining port well isolated from the input port within the operating frequency band. This arrangement yields an appropriate 90° phase difference across a reasonably wide frequency band. However, both circuits of FIGS. 3 and 4 additionally comprise a 180° coupler. Conventional 180° couplers do not provide a precise 180° phase difference across a reasonably wide frequency band. This is true in particular for rat race couplers.

Figure 5:
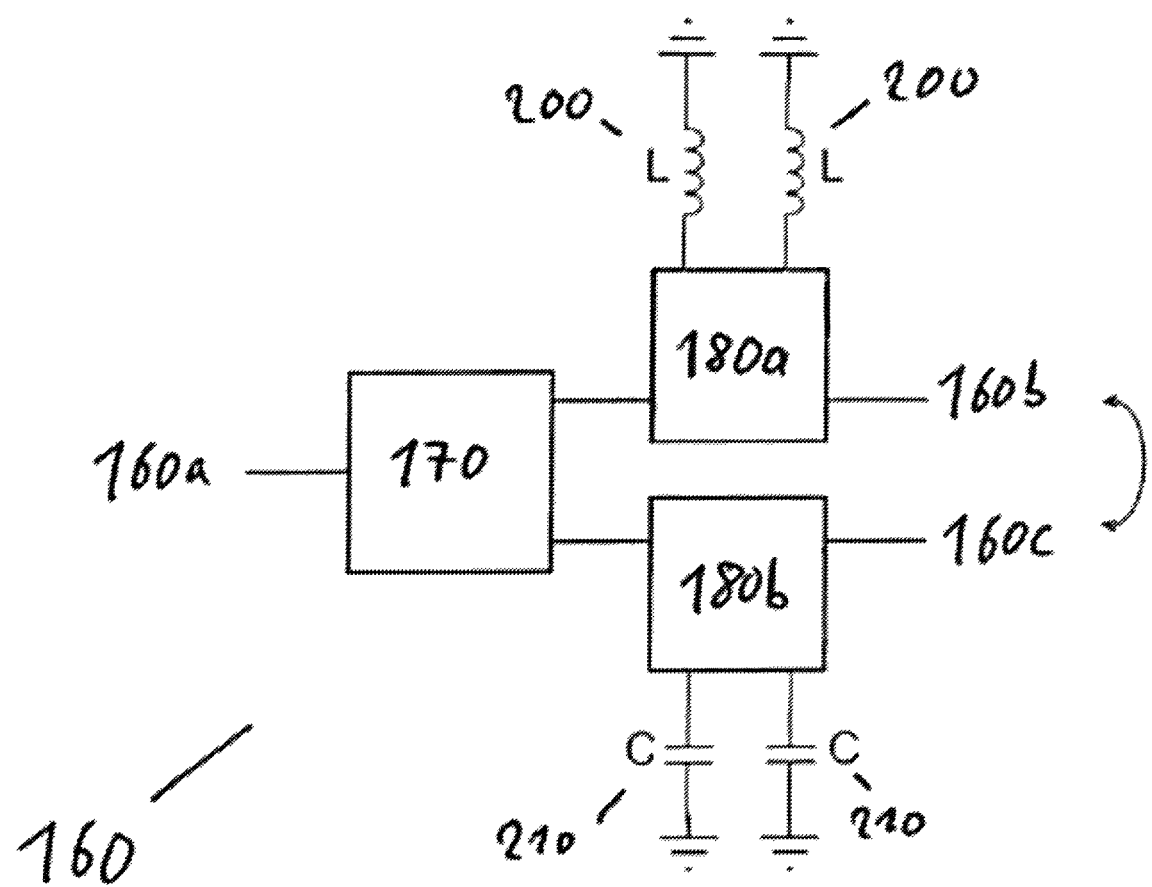
FIG. 5 shows a block diagram of a first embodiment of a 180° differential phase splitter for use in the feeding network according to the first or second embodiment.

Consequently, a novel 180° coupler is shown in FIG. 5. This 180° coupler may be used in the coupling circuits of FIGS. 3 and 4. The 180° coupler of FIG. 5 comprises an input 160*a* and two outputs 160*b* and 160*c*. The input signal is fed to a power splitter 170. The power splitter 170 outputs two identical signals with the same magnitude, frequency and phase. The amplitude of the output signal of the power splitter is half the amplitude of its input signal. Additionally, the 180° coupler of FIG. 5 comprises two essentially identical 90° couplers These 90° couplers are quadrature hybrids 180*a* and 180*b*. The quadrature hybrids 180*a* and 180*b* differ only in that the quadrature hybrid 180*a* is adapted to shift the input signal by +90°, whereas the quadrature hybrid 180*b* is adapted to shift the input signal by −90°. For example, quadrature hybrids 180*a* and 180*b* can be identical and the impedance used to terminate them may be different. For example hybrid 180*a* is loaded with inductors 200 while 180*b* is loaded with capacitors 210. This results in turn in two output signals 160*b* and 160*c*, with a 180° phase difference. Since only broadband power splitter 170 and quadrature hybrids are employed, the resulting 180° phase difference is maintained over the same frequency band as quadrature hybrids. The quadrature hybrid 180*a* has a certain phase versus frequency variation (dispersion). A constant 180° phase difference between the 2 outputs 160*b* and 160*c* is desired, thus equal dispersion. This means that each output of 170 needs a phase shifter, e.g. one phase shifter 1 consists of 180*a* and 2 inductors 200, the other phase shifter consists of 180*b* and 2 capacitors 210.

In order to have a 180° phase difference the reactive loads 200 and 210 of the 2 quadrature hybrids need to be opposite in phase. Shorting or leaving the reflected outputs open is a possible implementation, but does not work very well because of an impedance mismatch and the hybrids can not be tuned to compensate for this impedance mismatch. Quadrature hybrid 180*a* is connected to two inductive loads 200, whereas quadrature hybrid 180*b* is connected to two capacitive loads 210. Therefore, the output phase of the respective quadrature hybrids 180a and 180b have a 180° phase difference. The magnitude of the impedance of the capacitive load is equal to the magnitude of the impedance of the inductive load and the phase of the impedance of the capacitive load is opposite to the phase of the impedance of the inductive load. The best wideband implementation is based on lumped element reactive loads because of their frequency less variant behaviour. In analogy with the short/open, one phase shifter needs capacitors while the other one needs inductors at the outputs. Reflection occurs at the inductors and capacitors. This results in the correct phase behaviour over the entire hybrid bandwidth.

To provide a 180° splitter a first device for phase shifting one of the two output signals from the power splitter and a second device for phase shifting the other of the two output signals from the power splitter can be provided whereby the total phase difference between the one output signal and the other output signal is 180°. Hence it is not necessary to always have exactly plus or minus 90° phase shift on the outputs provided the difference is 180°.

The following equations can be derived for a 180° phase difference between the outputs 160b and 160c:

$$Z_0 = \frac{1}{2\pi f C} \quad \text{Eq1}$$

$$Z_0 = 2\pi f_l L \quad \text{Eq2}$$

Z is the characteristic impedance magnitude of the capacitor and the inductor and is equal to the system impedance, usually 50Ω.

The equations can be rearranged to:

$$f = \frac{1}{2\pi\sqrt{LC}} \quad \text{Eq3}$$

$$Z_0 = \sqrt{\frac{L}{C}} \quad \text{Eq4}$$

Figure 6:
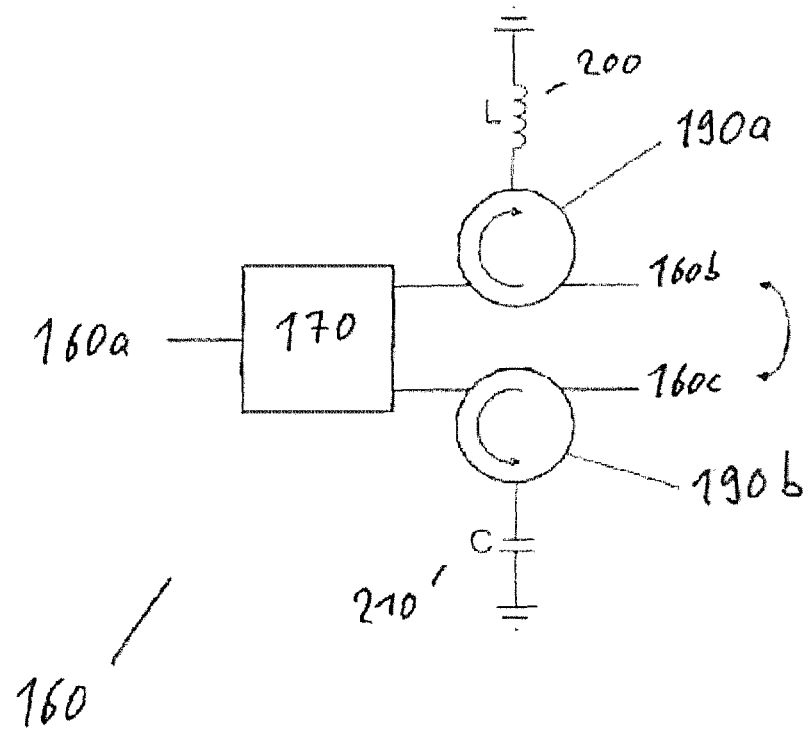
FIG. 6 shows a block diagram of a second embodiment of a 180° differential phase splitter for use in the feeding network according to the first or second embodiment.

FIG. 6 shows another implementation of a 180° coupler for use in the electrical couplers according to FIGS. 3 and 4. The implementation and functioning of said 180° coupler largely corresponds to the way it is implemented in the embodiment of FIG. 5. Therefore, identical reference signs depict identical features in FIGS. 5 and 6. The 180° coupler of FIG. 6 differs from 180° coupler of FIG. 5 in that the quadrature hybrid couplers have been replaced by circulators. Furthermore, the circulators are three port devices, such that only a single reactive load is connected to the respective circulators. The appropriate choice of reactive loads is determined in the same way as in the case of the 180° coupler of FIG. 5.

The invention claimed is:

1. A 180° coupler comprising:
a power splitter for splitting the input signal of the 180° coupler into two in phase output signals of equal power;
a first device for phase shifting one of the two in phase output signals from the power splitter, and
a second device for phase shifting the other of the two in phase output signals from the power splitter,
wherein the first device comprises a multiport coupler, said multiport coupler having a multiport coupler input, at least one multiport coupler output and a multiport coupler isolated port, said multiport coupler isolated port forming the first device output, wherein the at least one multiport coupler output is connected to an inductive load, and
wherein the second device comprises multiport coupler, said multiport coupler having a multiport coupler input, at least one multiport coupler output and a 90° hybrid multiport coupler isolated port, said multiport coupler isolated port forming the second device output, wherein the at least one multiport coupler output of the second device is connected to a capacitive load, and
wherein the total phase difference between the first device output signal and the second device output signal is 180°.

2. The 180° coupler according to claim 1, wherein said multiport coupler of the first device is a 90° hybrid coupler.

3. The 180° coupler according to claim 1, wherein said multiport coupler of the second device is a 90° hybrid coupler.

4. The 180° coupler according to claim 2, wherein said 90° hybrid coupler of the first device has two 90° hybrid coupler outputs.

5. The 180° coupler according to claim 3, wherein said 90° hybrid coupler of the second device has two 90° hybrid coupler outputs.

6. The 180° coupler according to claim 4, wherein said two 90° hybrid coupler outputs of the first device are each connected to the inductive load.

7. The 180° coupler according to claim 5, wherein said two 90° hybrid coupler outputs of the second device are each connected to the capacitive load.

8. The 180° coupler according to claim 1, wherein said multiport coupler of the first device is a circulator, said circulator having a circulator input, a circulator output and a circulator isolated port, said circulator isolated port forming the first device output, wherein the circulator output port is connected to an inductive load.

9. The 180° coupler according to claim 1, wherein said multiport coupler of the second device is a circulator, said circulator having a circulator input, a circulator output and a circulator isolated port, said circulator isolated port forming the second device output, wherein the circulator output port is connected to a capacitive load.

10. The 180° coupler according to claim 1, wherein a magnitude of an impedance of said capacitive load is equal to a magnitude of an impedance of said inductive load and a phase of the impedance of said capacitive load is opposite to a phase of the impedance of said inductive load.

11. A feeding network for connecting to radiating or receiving elements of an antenna to each other, said feeding network comprising one feed input and a first, second, third and fourth feed output, each of said feed outputs being for connection to at least one of said radiating or receiving elements via a feed probe of each radiating or receiving element, an electrical coupler being adapted to generate first, second, third and fourth feed output signals at the first, second, third and fourth feed outputs, respectively, from a single input signal, wherein the first feed output signal is phase shifted by 90° in relation to the second feed output signal, by 180° in relation to the third feed output signal and by 270° in relation to the fourth feed output signal, further comprising: one 180° coupler having a 180° coupler input and two 180° coupler outputs, wherein the 180° coupler input is connected to the input of said electrical coupler; and two 90° couplers each having a 90° coupler input and two 90° coupler outputs, the four 90° coupler outputs of said two 90° couplers forming the first, second, third and fourth output signals of the electrical coupler, respectively; wherein each 90° coupler input is connected to one of said two 180° coupler outputs, or one 90° coupler having a 90° coupler input and two 90° coupler outputs, wherein the 90° coupler input is connected to the input of said electrical coupler; and two 180° couplers each having a 180° coupler input and two 180° coupler outputs, the four 180° coupler outputs of said two 180° couplers forming the first, second, third and fourth output of the electrical coupler, respectively; wherein each 180° coupler input is connected to one of said two 90° coupler outputs, and each 180° coupler comprises a power splitter for splitting the input signal of the 180° coupler into two in phase output signals of equal power; a first device for phase shifting one of the two in phase output signals from the power splitter, and a second device for phase shifting the other of the two in phase output signals from the power splitter, wherein the first device comprises a multiport coupler, multiport coupler having a multiport coupler input, at least one multiport coupler output and a multiport coupler isolated port, said multiport coupler isolated port forming the first device output, wherein the at least one multiport coupler output is connected to an inductive load, and wherein the second device comprises multiport coupler, said multiport coupler having a multiport coupler input, at least one multiport coupler output and a 90° hybrid multiport coupler isolated port, said multiport coupler isolated port forming the second device output, wherein the at least one multiport coupler output of the second device is connected to a capacitive load, and wherein the total phase difference between the first device output signal and the second device output signal is 180°.

12. The feeding network according to claim 11, wherein said multiport coupler of the first device is a 90° hybrid coupler.

13. The feeding network according to claim 11, wherein said multiport coupler of the second device is a 90° hybrid coupler.

14. The feeding network according to claim 12, wherein said 90° hybrid coupler of the first device has two 90° hybrid coupler outputs.

15. The feeding network according to claim 13, wherein said 90° hybrid coupler of the second device has two 90° hybrid coupler outputs.

16. The feeding network according to claim 14, wherein said two 90° hybrid coupler outputs of the first device are each connected to the inductive load.

17. The feeding network according to claim 15, wherein said two 90° hybrid coupler outputs of the second device are each connected to the capacitive load.

18. The feeding network according to claim 11, wherein said multiport coupler of the first device is a circulator, said circulator having a circulator input, a circulator output and a circulator isolated port, said circulator isolated port forming the first device output, wherein the circulator output port is connected to an inductive load.

19. The feeding network according to claim 11, wherein said multiport coupler of the second device is a circulator, said circulator having a circulator input, a circulator output and a circulator isolated port, said circulator isolated port forming the second device output, wherein the circulator output port is connected to a capacitive load.

20. The feeding network according to claim 11, wherein the magnitude of an impedance of said capacitive load is equal to a magnitude of the impedance of said inductive load and a phase of the impedance of said capacitive load is opposite to a phase of the impedance of said inductive load.

* * * * *